United States Patent [19]
Blank

[11] 3,941,648
[45] Mar. 2, 1976

[54] CRYSTAL GROWTH ON HG$_3$TEO$_6$

[75] Inventor: Zvi Blank, Morris Plains, N.J.

[73] Assignee: Allied Chemical Corporation, New York, N.Y.

[22] Filed: Jan. 31, 1975

[21] Appl. No.: 545,952

[52] U.S. Cl. .............. 156/622; 423/508; 423/592; 23/300; 23/305 R; 23/273 R
[51] Int. Cl.$^2$ .................. B01J 17/04; C01G 13/00
[58] Field of Search .......... 423/508, 593, 101, 102; 23/300, 301 R, 305 R, 273 R, 273 H; 156/621 H, 622, 623

[56] References Cited
UNITED STATES PATENTS

| | | | |
|---|---|---|---|
| 3,309,168 | 3/1967 | Boyer | 423/508 |
| 3,622,399 | 11/1971 | Johnson | 423/508 |

OTHER PUBLICATIONS

J. of Amer. Chem. Soc., Hutchins, 1905, pp. 1157–1123, Vol. 27.
Chemical Reviews, Dulton et al., Dec. 1966, Vol. 6, No. 6, pp. 657–675.
Journal of Less Common Metals, 23, 1971, pp. 313–315, (printed Netherlands).
Transaction of Electro–Chem. Soc., Vol. 61, 1932, pp. 113–121.

*Primary Examiner*—Norman Yudkoff
*Assistant Examiner*—S. J. Emery
*Attorney, Agent, or Firm*—Arthur J. Plantamura; David W. Collins

[57] ABSTRACT

Single crystals of Hg$_3$TeO$_6$, which are useful in, for example, acousto-optic applications, are grown on rotating seed crystals in aqueous solution at an elevated temperature. A two-step process is employed in which supersaturation is achieved by a substantially homogeneous increase in pH throughout the solution under substantially isothermal conditions, followed by a decrease in temperature at substantially constant pH. The homogeneous increase in pH is attained by adding a compound such as urea whose rate of hydrolysis may be controlled by solution pH and temperature. The use of such a compound ensures thorough mixing of the compound in the solution before the compound hydrolyzes to produce a pH-altering substance.

6 Claims, 1 Drawing Figure

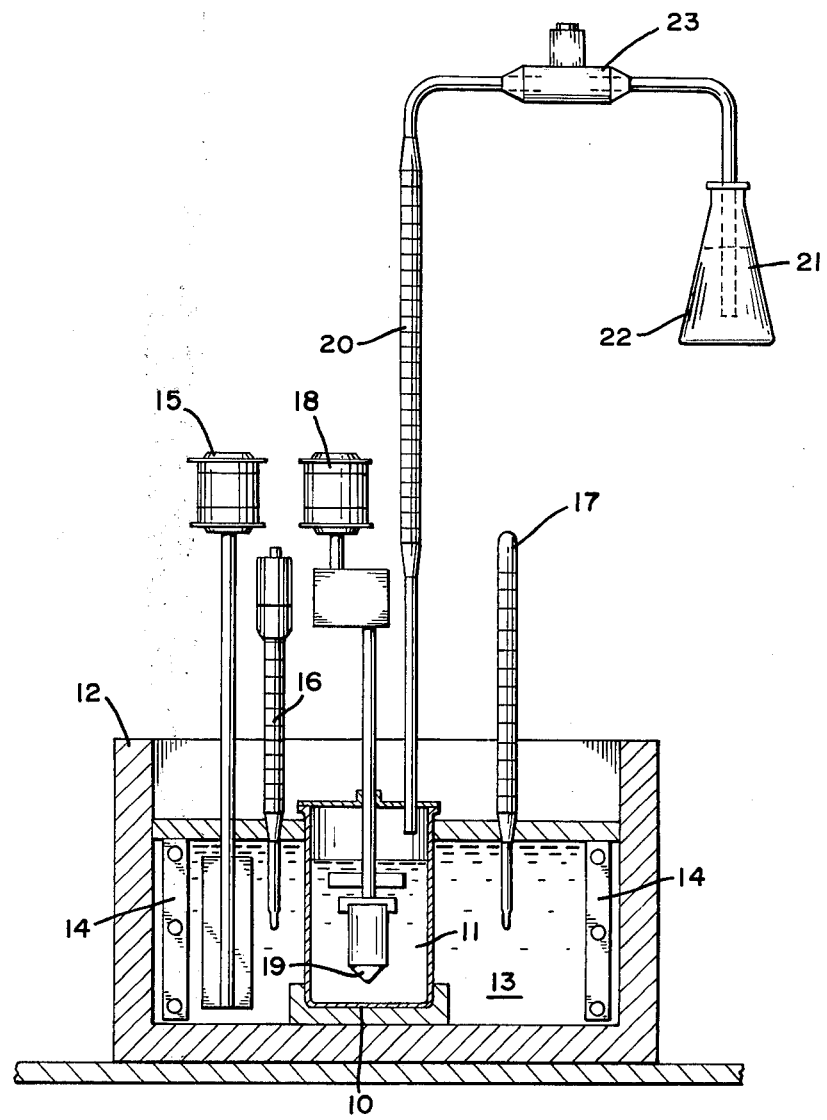

CRYSTAL GROWTH ON $Hg_3TeO_6$

BACKGROUND OF THE INVENTION

1. Field of the Invention

This invention is concerned with a technique for growing single crystals of mercury tellurate ($Hg_3TeO_6$).

2. Description of the Prior Art

Investigations into the properties of high valence tellurium ($Te^{+6}$) oxides have been concerned with compositions of the general formulae $M_2^{+3}TeO_6$ and $M_3^{+2}TeO_6$, where M is a cation, as indicated. A number of these compositions have found use as phosphors and in piezoelectric applications.

More recently, theoretical predictions have indicated that mercury tellurate ($Hg_3TeO_6$) has an acoustic-optic figure of merit that compares favorably with other well-known materials such as lead molybdate ($PbMoO_4$) and tellurium dioxide ($TeO_2$). However, in order to fabricate suitable devices for, e.g., acousto-optic applications, single crystals are necessary. The growth $Hg_3TeO_6$ crystals has been described by E. B. Hutchins, Jr., in Vol. 27, *Journal of the American Chemical Society*, pp. 1,157–1,183 (1905). There, crystals of $Hg_3TeO_6$ are grown by reacting concentrated aqueous solutions of potassium tellurate and mercury nitrate in an acidic solution. Attempts to reproducibly grow single crystals of sufficient size and optical quality for suitable measurements have not been successful using this technique. In addition, a variety of problems associated with employing well-known crystal growth techniques exist. For example, high temperature growth techniques, such as Czochralski, Kyropolous, Verneuil, etc., require temperatures that are higher than the decomposition temperature of this composition. On the other hand, solution growth techniques require a strong dependence of solubility on temperature, which this composition lacks.

SUMMARY OF THE INVENTION

In accordance with the invention, single crystals of mercury tellurate ($Hg_3TeO_6$) are grown by a modified solution growth technique. Specifically, a sufficient amount of the composition, or of components that will form the composition, is dissolved in a highly acidic aqueous solution at an elevated temperature to form a slightly undersaturated solution. Single crystals are grown on rotating seed crystals of $Hg_3TeO_6$ by a two-step process in which (a) the pH of the slightly undersaturated solution is increased substantially homogeneously under substantially isothermal conditions to obtain supersaturation, with consequent crystal growth, and (b) the solution temperature is then reduced, preferably to about room temperature, at substantially constant pH to complete the crystal growth. The substantially homogeneous increase in solution pH, that is, a simultaneous change in pH throughout the entire solution, is achieved by adding a compound whose rate of hydrolysis to produce a pH-altering compound is controllable by, for example, solution pH and temperature. A preferred compound having a controllable rate of hydrolysis is urea.

BRIEF DESCRIPTION OF THE DRAWING

The FIGURE, partly in cross-section and partly schematic, depicts apparatus suitable for growing single crystals of mercury tellurate in accordance with the invention.

DETAILED DESCRIPTION OF THE INVENTION

In an article by D. Pinnow in Vol. QE-6, IEEE Jour. of Quantum Electronics, pp. 223–238 (Apr. 1970), an acousto-optic figure of merit M is described, based on a combination of wellknown material properties. This figure of merit, which is useful for selecting promising new acousto-optic crystals for device applications, is given as:

$$M = n^6p^2/\rho V^3$$

where $n$ is the index of refraction of the crystal, $p$ is the photoelastic component, "$\rho$" is the density and V is the acoustic velocity. The values of $n$, $p$ and V are all related to tensor quantities and therefore vary with crystal orientation. A crystal cut that maximizes the figure of merit is chosen for device applications.

Using the criteria and procedure set forth in the foregoing reference, calculation have shown that mercury tellurate ($Hg_3TeO_6$) has a high figure of merit, larger than $TeO_2$ or $PbMoO_4$ in the longitudinal mode. In order to verify the calculation and in order to fabricate devices, single crystals of sufficient size and good optical quality of this compound must be reproducibly grown. Unfortunately, no methods for fabricating such single crystals have been reported. The usual techniques, such as flux growth and melt growth, require high temperatures that are higher than the decomposition temperature of $Hg_3TeO_6$. The usual solution growth process, in which temperature variation controls the degree of saturation, is also not viable, due to the weak temperature dependence of solubility of this composition.

In accordance with the invention, single crystals of mercury tellurate are prepared by a modified solution growth technique. Specifically, a sufficient amount of the composition ($Hg_3TeO_6$), or of components that will form the composition (e.g., mercuric and tellurate salts), is dissolved in a highly acidic aqueous solution at a pH near 0 and at an elevated temperature of about 40° to 80°C to form a slightly undersaturated solution. Single crystals are grown on rotating seed crystals of $Hg_3TeO_6$ by a two-step process in which (a) the pH of the slightly undersaturated solution is increased substantially homogeneously under substantially isothermal conditions to obtain supersaturation, with consequent crystal growth, and (b) the solution temperature is then reduced, preferably to about room temperature, at substantially constant pH to complete the crystal growth. The substantially homogeneous increase in solution pH, that is, a simultaneous change in pH throughout the entire solution, is achieved by adding a compound whose rate of hydrolysis to produce a pH-altering compound is controllable, for example, by solution pH and temperature. A preferred compound having a controllable rate of hydrolysis is urea.

Mercury tellurate is soluble at very low pH, with solubility decreasing as a function of increasing pH. Accordingly, supersaturation is achieved by raising the pH. However, mere addition of a diluted base, such as potassium hydroxide, which is a common technique for growing other single crystals, such as potassium dihydrogen phosphate, results in localized pH changes and uncontrolled nucleation. This leads to an undesirable format on of many small crystallites in the solution. In accordance with the invention, a substantially homogeneous change in pH is effected by using a compound that will change the pH of the entire solution simultaneously rather than merely at the point of addition. Examples of such a compound include urea and soluble isocyanate salts, such as potassium isocyanate and sodium isocyanate, etc. These are compounds which hydrolyze at a controllable rate. The products of the hydrolysis increase the pH of the highly acidic solution.

For example, urea ($CO(NH_2)_2$) in aqueous solution under both acidic and basic conditions hydrolyzes to form carbon dioxide ($CO_2$) plus ammonia ($NH_3$). The hydrolysis is slow, requiring an induction period that is a known function of both solution pH and temperature. Thus, the urea can be thoroughly mixed in the solution before it hydrolyzes.

In practice, the desired composition, or materials that will form the composition, is dissolved in a highly acidic aqueous solution at a pH near 0 and at an elevated temperature of about 40° to 80°C to form a slightly undersaturated solution. Apparatus suitable for solution growth, such as that described by J. J. Gilman in *The Art and Science of Growing Crystals*, John Wiley & Sons, New York (1963), is sufficient for the purpose of this invention. The hydrolyzing compound is slowly added at a controlled rate while at least one seed crystal of the desired composition and crystallographic orientation is rotated in the solution. As is well-known, a portion of the seed crystal dissolves, thereby producing a saturated solution and, at the same time, removing any surface damage from the seed crystal. The solution temperature is kept substantially constant. The hydrolyzing compound slowly hydrolyzes in the growth solution, resulting in a pH increase, which increases the degree of saturation. For $Hg_3TeO_6$, supersaturation is achieved at a pH of about 1.5. When that final pH value is attained, addition of the hydrolyzing compound is terminated. The solution temperature is then reduced, preferably to room temperature, at a controlled rate, while the solution pH is kept substantially constant. Approximately 70 to 80 percent of the crystal growth occurs during the pH change; the balance of the crystal growth occurs during the temperature reduction.

The final pH value must be carefully controlled. Below the final value, insufficient supersaturation occurs. Above the final value, undesirable side reactions occur. For example, the maximum pH value that can be tolerated for the growth of $Hg_3TeO_6$ is about 1.5; above that value, undesirable additional compositions, such as $Hg_2H_2TeO_6$ or $HgH_4TeO_6$, appear. This maximum pH value is substantially independent of temperature.

The rate of addition of the hydrolyzing compound depends on the composition of the crystal to be grown, the solution volume, and the hydrolyzing compound employed. The rate of addition must be experimentally determined for each new set of conditions. For example, in growing single crystals of $Hg_3TeO_6$ from a solution of 150 volume parts and using an aqueous solution of 0.75M urea as the hydrolyzing compound, an addition rate of about 1.2 to 2.8 volume parts/hr is generally sufficient.

The rotation rate of the seed crystal in solution generally ranges from about 10 to 30 rpm. Higher rotational rates may cause turbulence, which leads to spurious nucleation, while lower rotational rates tend to adversely affect the uniformity of growth rate.

Control of the solution temperature is important. A high solution temperature, at least about 40°C, increases the hydrolysis rate, which is desirable. Too high a temperature, above about 80°C, may result in either an excessive rate of evaporation of the solvent, with consequent localized change in saturation, or boiling. For the growth of $Hg_3TeO_6$, a growth temperature of about 52° to 75°C is preferred.

In addition to completing the crystal growth and in order to avoid thermal shock upon bringing the single crystals to room temperature, the solution temperature must be slowly and controllably reduced to about room temperature at substantially a constant pH. A typical rate consistent with reducing the temperature as fast as possible without attendant stress cracking, is about 0.5° to 4°C/hr, and preferably about 2°C/hr.

Shown in the FIGURE is apparatus suitable for growing single crystals of $Hg_3TeO_6$ in accordance with the invention. A growth chamber 10 contains a growth solution 11, in which is dissolved the desired composition, single crystals of which are to be grown. The growth chamber is partly immersed in a constant temperature bath 12. The constant temperature bath contains a suitable heat transfer fluid 13, such as mineral oil, silicone oil, etc., for controlling the temperature of the growth solution. Heating elements 14 are used to heat the bath. A bath agitator 15 ensures temperature uniformity of the bath. A thermoregulator 16 is connected to the heating elements and to a temperature cycle programmer (not shown) for controlling the temperature of the bath. A thermometer 17 monitors the bath temperature. A combination stirrer and seed holder 18 rotates at least one seed crystal 19 in the growth solution at a rate sufficient to ensure rapid crystal growth consistent with minimal solution turbulence. A burette 20 delivers the slowly hydrolyzing compound, dissolved in solution 21, to the growth solution. The slowly hydrolyzing compound in solution is contained in a reservoir 22. The rate of addition of the compound is controlled through a solenoid valve 23, employing suitable circuitry (not shown), which relates the amount of compound added to the time of addition by means of a timer. Controlling the rate of addition in this manner arises from a knowledge of the hydrolysis rate, which is a function of solution pH and temperature. Suitable curves relating these parameters can be used to derive the required amount of compound added over a specific period of time to attain the desired final pH value.

Alternative methods of adding the slowly hydrolyzing compound includes replacing the burette and solenoid system with either a gel column or a series of membranes of controlled pore size. In the former case, the rate of addition depends upon the rate of diffusion through the gel, which is kept at the same pH as the compound in order to avoid premature hydrolysis. In the latter case, the rate of addition depends upon the pore size.

EXAMPLES

1. About 60 g of $Hg_3TeO_6$ (powder) was dissolved in 150 ml 8.5N $HNO_3$ solution at about 75°C. The solution was slightly undersaturated. This solution was placed in an apparatus of the type described in the accompanying FIGURE. Seeds for crystal growth were mounted on a plastic (polytetrafluoroethylene) stirrer, which was rotated at a rate of about 20 rpm. The assembly was allowed to reach an equilibrium temperature of about 72° to 74°C. To initiate growth, an aqueous solution of urea (0.75M) was added dropwise, using a solenoid valve system capable of producing flow rates varying from about 1.2 to 2.8 ml/hr. Upon reaching a pH value of 1.5, the addition of urea was terminated. The solution temperature was reduced to room temperature at a rate of about 2°C/hr, using a temperature cycle programmer. After a total growth period of about 11 days, a single crystal 3 mm on edge was obtained.

2. About 45 g of $Hg_3TeO_6$ (powder) was dissolved in 150 ml 6N $HNO_3$ solution at about 65°C. The solution was slightly undersaturated. This solution was placed in an apparatus of the type described in the accompanying FIGURE. Seeds for crystal growth were mounted on a plastic (polytetrafluoroethylene) stirrer, which was rotated at a rate of about 10 rpm. The assembly was allowed to reach an equilibrium temperature of about 62° to 64°C. To initiate growth, an aqueous solution of urea (0.5M) was added dropwise, using a solenoid valve system capable of producing flow rates varying from about 1.2 to 2.8 ml/hr. Upon reaching a pH value of 1.5, the addition of urea was terminated. The solution temperature was reduced to room temperature at a rate of about 2°C/hr, using a temperature cycle programmer. After a total growth period of about 15 days, a single crystal 2 mm on edge was obtained.

What is claimed is:

1. A process for growing single crystals of mercury tellurate ($Hg_3TeO_6$) on rotating seed crystals of $Hg_3TeO_6$ from a slightly undersaturated highly acidic aqueous solution of pH near 0 at an elevated temperature which comprises
   a. adding a hydrolyzing compound having a controllable rate of hydrolysis to the slightly undersaturated aqueous solution maintained under substantially isothermal conditions to increase the pH of the solution to a value of about 1.5 substantially homogeneously throughout the solution and to effect crystal growth; and
   b. then slowly reducing the solution temperature to about room temperature at substantially constant pH to complete the crystal growth.

2. The process of claim 1 in which the elevated temperature ranges from about 40° to 80°C.

3. The process of claim 2 in which the elevated temperature ranges from about 52° to 75°C.

4. The process of claim 1 in which the hydrolyzing compound comprises one of the compounds selected from the group consisting of urea, potassium isocyanate and sodium isocyanate.

5. The process of claim 4 in which the hydrolyzing compound comprises urea.

6. The process of claim 1 in which the solution temperature is reduced at a rate of about 0.5° to 4°C/hr.

* * * * *

UNITED STATES PATENT OFFICE
CERTIFICATE OF CORRECTION

PATENT NO. : 3,941,648
DATED : March 2, 1976
INVENTOR(S) : Zvi Blank

It is certified that error appears in the above-identified patent and that said Letters Patent are hereby corrected as shown below:

Title Page [54] "ON" should read -- OF --.

Column 1, line 1 (Title) "ON" should read -- OF --.

Column 2, line 8, "wellknown" should read -- well-known --.

line 68, "format on" should read -- formation --.

column 6, line 4, "aqeuous" should read -- aqueous --.

Signed and Sealed this eighth Day of June 1976

[SEAL]

Attest:

RUTH C. MASON
*Attesting Officer*

C. MARSHALL DANN
*Commissioner of Patents and Trademarks*